United States Patent
Bhatia et al.

(12)

(10) Patent No.: US 6,205,022 B1
(45) Date of Patent: *Mar. 20, 2001

(54) APPARATUS FOR MANAGING HEAT IN A COMPUTER ENVIRONMENT OR THE LIKE

(75) Inventors: Rakesh Bhatia, San Jose; Robert D. Padilla, Milpitas, both of CA (US)

(73) Assignee: Intel Corporation, Santa Clara, CA (US)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/917,914

(22) Filed: Aug. 27, 1997

(51) Int. Cl.[7] .......................... H05K 7/20; H01L 23/427
(52) U.S. Cl. .................. 361/687; 361/699; 361/700; 174/15.2; 165/80.4; 165/104.33
(58) Field of Search .................. 361/687, 699, 361/700; 174/15.2; 165/80.4, 104.33

(56) References Cited

U.S. PATENT DOCUMENTS

| | | | |
|---|---|---|---|
| 4,019,098 | * 4/1977 | McCready et al. | 361/687 |
| 5,283,715 | * 2/1994 | Carlsten et al. | 165/104.33 |
| 5,355,942 | * 10/1994 | Conte | 165/104.33 |
| 5,383,340 | * 1/1995 | Larson et al. | 361/700 |
| 5,400,213 | * 3/1995 | Honda et al. | 361/687 |
| 5,455,746 | * 10/1995 | Sato et al. | 361/687 |
| 5,513,070 | * 4/1996 | Xie et al. | 165/80.5 |
| 5,581,443 | * 12/1996 | Nakamura et al. | 361/687 |
| 5,598,320 | * 1/1997 | Toedtman et al. | 165/104.33 |
| 5,617,301 | * 4/1997 | Sato et al. | 361/687 |
| 5,627,731 | * 5/1997 | Sato et al. | 361/687 |
| 5,634,351 | * 6/1997 | Larson et al. | 361/700 |
| 5,642,776 | * 7/1997 | Meyer, IV et al. | 165/104.33 |
| 5,712,762 | * 1/1998 | Webb | 361/687 |
| 5,734,550 | * 3/1998 | Penniman et al. | 361/687 |
| 5,818,693 | * 10/1998 | Garner et al. | 174/15.2 |
| 5,822,187 | * 10/1998 | Garner et al. | 174/15.2 |
| 5,826,643 | * 10/1998 | Gaylon et al. | 165/80.4 |
| 5,871,042 | * 2/1999 | Gutfeldt et al. | 165/80.4 |
| 5,937,936 | 8/1999 | Furukawa et al. | 165/104.33 |
| 5,946,191 | * 8/1999 | Oyamada | 361/700 |
| 5,960,866 | * 10/1999 | Kimura et al. | 165/104.33 |

OTHER PUBLICATIONS

Eric C. Guyer Handbook of Applied Thermal Design, Copyright 1989, pp. 7–50 thru 7–58.

* cited by examiner

*Primary Examiner*—Leo P. Picard
*Assistant Examiner*—Lisa Lea-Edmonds
(74) *Attorney, Agent, or Firm*—Kenyon & Kenyon (57) ABSTRACT

To manage heat in a computer environment or the like, a base plate and/or a input/output (I/O) plate includes an integrated heat pipe. For example, the base plate, located between a bottom surface of a laptop computer chassis and a printed circuit board (PCB) or motherboard would include a heat-pipe network that draws heat away from the heat generating components of the PCB (e.g., a processor) and distributes the heat over the base plate. The I/O plate may also serve the same purpose, located at an end of the PCB. The base plate heat pipe and I/O plate heat pipe are thermally coupled together or are of a unitary design so as to distribute the heat generated in the laptop computer over a larger area achieving a relatively low-temperature isothermal design.

13 Claims, 7 Drawing Sheets

APPARATUS FOR MANAGING HEAT IN A COMPUTER ENVIRONMENT OR THE LIKE

BACKGROUND OF THE INVENTION

1. Field of the Invention

The present invention pertains to an apparatus for managing heat in a computer environment or the like. More particularly, the present invention pertains to a method and apparatus for managing heat generated by electronic circuitry using a base plate and/or input/output plate with an integrated heat pipe.

2. Background Information

Electronic circuits, particularly integrated circuit (IC) chips, tend to generate an appreciable amount of heat during operation. If the heat is not sufficiently removed from the ambient area surrounding the IC chip, the electronic circuit therein may not operate properly. For example, specifications for a Pentium® processor (Intel Corporation, Santa Clara, Calif.) operating at 66 Megahertz (MHZ) provide a maximum temperature of 70° C. for the ambient air surrounding the processor. Thus, if the temperature of the ambient air surrounding the processor exceeds this maximum temperature, there exists a possibility that the processor will not operate correctly.

Figure 1:
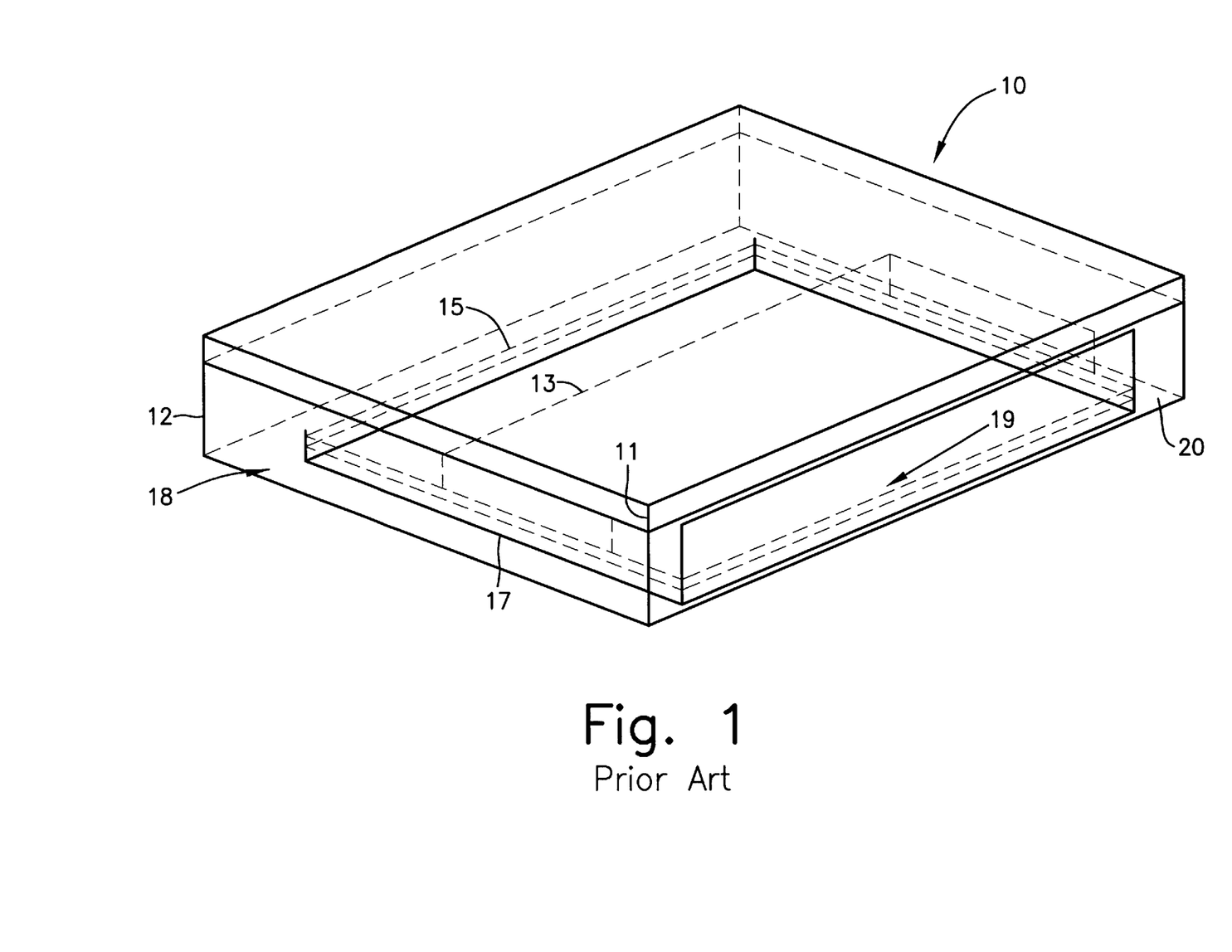
FIG. 1 is a view of a laptop computer as is known in the art.

Referring to FIG. 1, a view of a laptop computer 10 is shown. Laptop computer 10 includes a screen 11 and a main chassis 12. As is known in the art, the main chassis includes a keyboard component 13 having a support plate onto which is mounted a printed circuit board (PCB) and a plurality of keys. Under keyboard component 13 is another PCB 15 (sometimes referred to as a motherboard) which may include components such as one or more processors (e.g., a Pentium® processor), memory modules, and a variety of other electronic components. PCB 15 may be mounted to a base plate 17 extending over an area of a base 18 of laptop computer 10. Laptop computer 10 also includes an Input/Output (I/O) plate 19 which is at a back end 20 of the computer 10 in this example. The I/O plate 19 includes a number of openings that house connections that may be coupled to any of a variety of peripheral devices (e.g., an external floppy drive, a docking station, etc.).

Certain components on PCB 15 (e.g., the processor) generate more heat than others. Some known methods for dissipating heat from the Pentium® processor set forth above are described in Application Note APA480 "Pentium® Processor Thermal Design Guidelines Rev. 2.0," Nov. 1995 (see, e.g., Pentium® and Pentium® Pro Processors and Related Products, 1996, pp. 2-1337 to 2-1363 obtainable from McGraw-Hill Book Company). These methods include the placement of a heat sink on top of the processor and increasing air flow over the processor so that the ambient air (heated by the processor) may be removed. In a personal computer environment, the processor is typically coupled electrically to other devices on a PCB. These other devices also generate heat and employ the above identified heat removing methods to operate correctly.

Another device for removing heat from a component, such as a processor, is a heat pipe. A heat pipe typically has a round cross-section including two paths extending the length of the pipe. The heat pipe (e.g., an end of the heat pipe) is placed proximately to a component, such as a processor. Working fluid in the heat pipe (e.g., water) is heated at the component and vaporized. The vapor travels away from the component in a hollow, first path of the heat pipe (this first path typically has a relatively large cross-sectional area). Eventually, the vapor is cooled at another location in the heat pipe. For example, the vapor may be cooled over a heat sink device mentioned above. The vapor condenses to form working fluid and the working fluid travels back to the processor through a second path, sometimes referred to as a wick structure, via capillary action. Thus, the heat pipe continuously circulates working fluid and vapor to remove heat from the processor. Further details on the operation of heat pipes can be found in *Handbook of Applied Thermal Design* (1989, ed., Eric C. Guyer, pp. 7-50 to 7-58).

Figure 2:
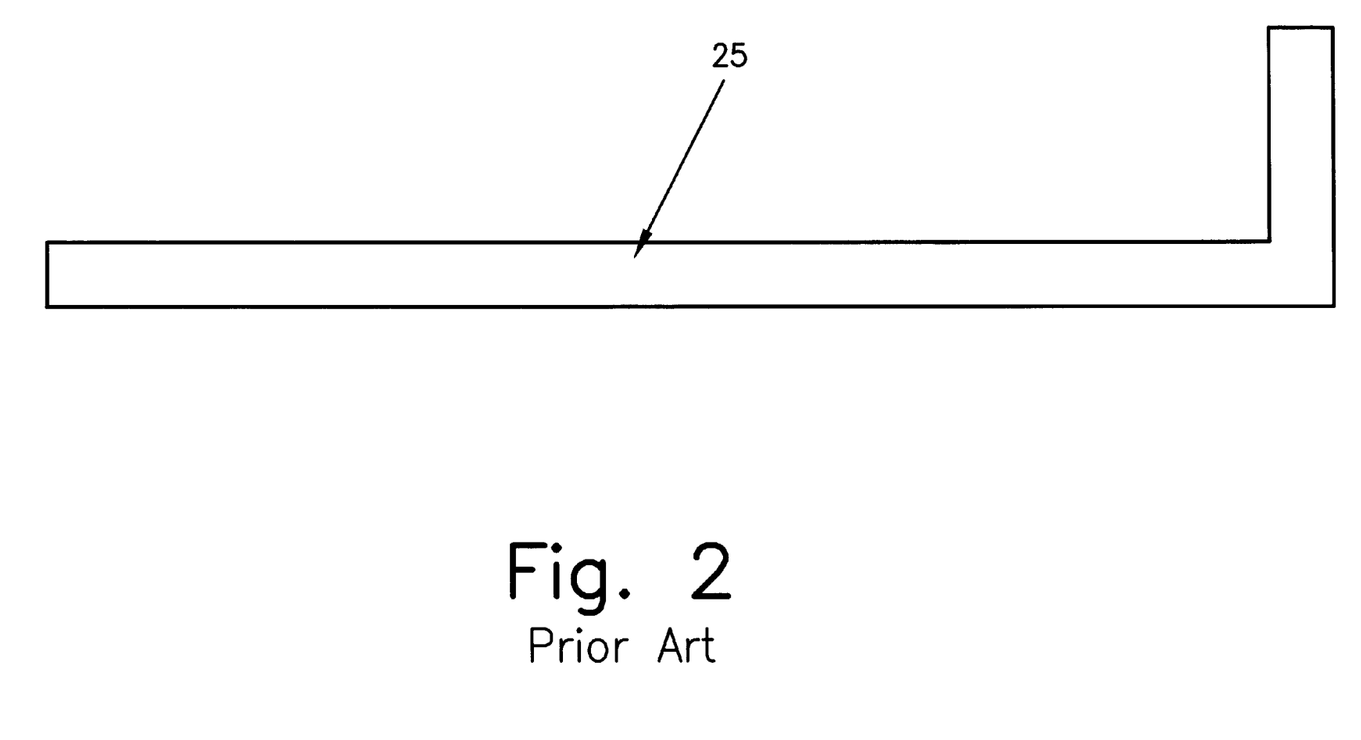
FIG. 2 is a side view of a combined base plate and I/O plate as is known in the art

The use of devices for managing heat becomes very important in mobile computer systems, such as laptop computer 10 shown in FIG. 1. Because of their small size, especially in height, there is generally insufficient space for air flow past components in a laptop computer. Base plate 17 is made of a metal such as steel or aluminum which tends to conduct the heat generated by components on PCB 15 to all areas of base plate 17. Also, base plate 17 and I/O plate 19 may be combined into a single L-shaped plate 25 shown in FIG. 2. Doing so expands the area for spreading the heat generated by PCB components. Due to the relatively poor thermal conductivity of these metals, thermal gradients do occur in the base plate, which in turn causes some sections of base plate 17 and/or I/O plate 19 to be warmer than others thus limiting the thermal capabilities.

Heat pipes, as described above, may be used to improve heat management in laptop computers having a base plate 17 and I/O plate 19. The heat pipe is typically used to couple the heat of the processor to the base plate 17. Doing so has at least two significant drawbacks. First, incorporating heat pipes into the computer structure increases manufacturing costs and complexity in that it is desirable for the heat-pipe to be precisely placed and attached to the PCB adding a number of manufacturing steps to laptop computer fabrication. Also, the heat pipe is attached to the PCB in different locations creating a situation where some areas on the PCB are hotter than others. These differences in temperature may be perceived by a user, and the efficiency of the heat removal system is reduced. Accordingly, there is a need for an apparatus for improving heat management for electronic circuits, especially for laptop and notebook computers.

SUMMARY OF THE INVENTION

One embodiment of an apparatus of the present invention provides a base plate in a computer system having an integrated heat pipe. Alternatively, in another embodiment, an apparatus of the present invention provides an I/O plate in a computer system having an integrated heat pipe. With a base plate or I/O plate constructed according to embodiments of the present invention, the thermal management of a computer system or the like is improved, allowing for a better distribution of heat over the areas of the base plate or I/O plate.

DETAILED DESCRIPTION

As described in further detail, herein, a base plate and an I/O plate with an integrated heat pipe are described for cooling components in a laptop computer environment. One skilled in the art will appreciate that the base plate heat pipe and I/O base plate heat pipe may be used in a variety of other environments involving electronic circuits such as in personal computers, testing equipment, etc.

Figures 3, 4:
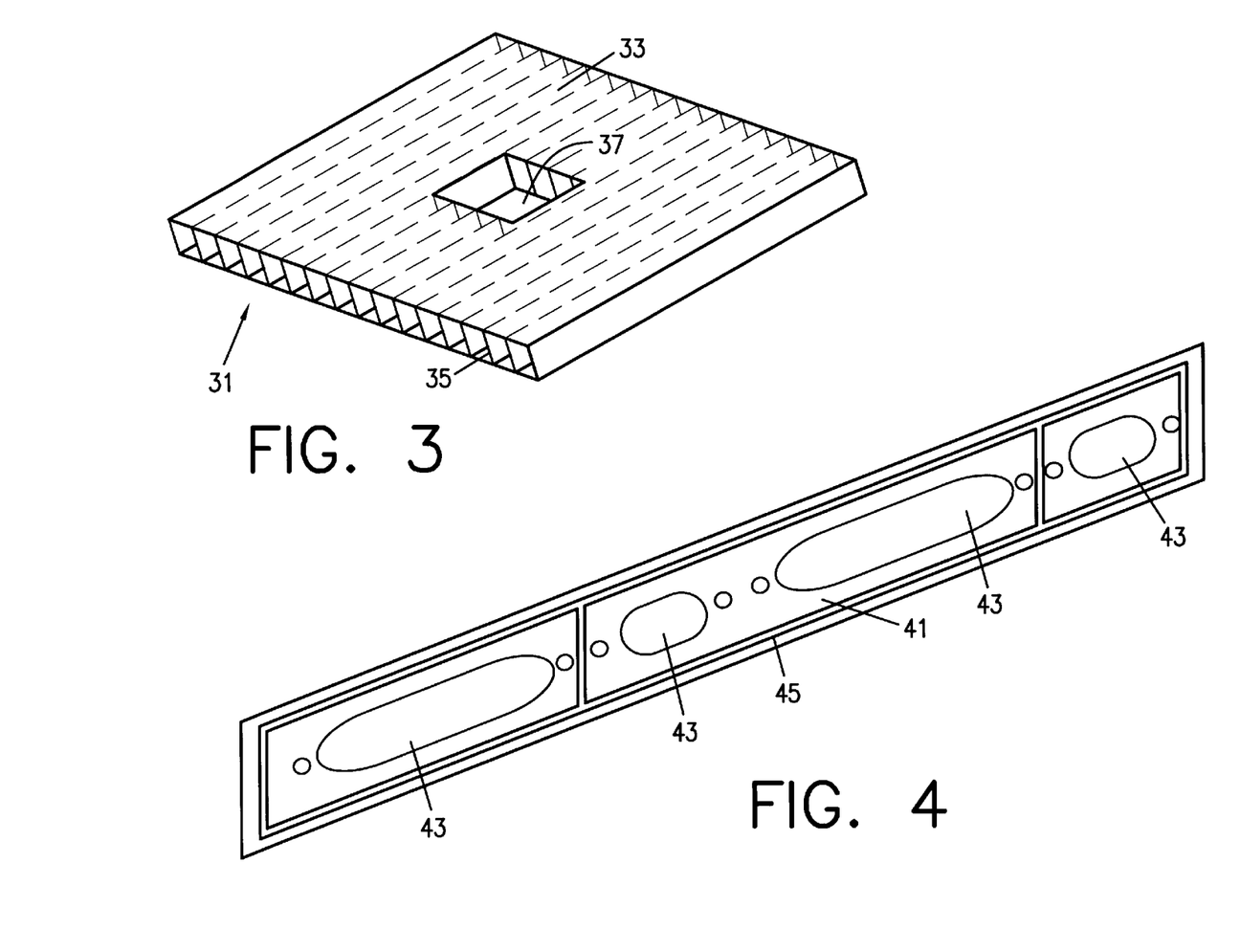
FIG. 3 is a view of a base plate constructed according to an embodiment of the present invention.
FIG. 4 is a view of an I/O plate constructed according to an embodiment of the present invention.

Referring to FIG. 3, a base plate 31 constructed according to an embodiment of the present invention is shown. The base plate 31 includes one or more integrated heat pipes 33. In this embodiment, a plurality of heat pipes 33 are provided, arranged in a parallel configuration, although the invention is not limited in scope in this respect. Heat pipes 33 are separated by sidewalls 35 and each heat pipe 33 is sealed so as to contain a vaporizable liquid which serves as the working fluid for the heat pipe. In operation in this embodiment, a heat pipe draws vaporized fluid away from a heat source (the evaporator region of the heat pipe) to a condenser region of the heat pipe. Each heat pipe 33 includes a wick structure (not shown), which by means of capillary flow, transports the condensed liquid from the condenser region back into the evaporator region of the heat pipe. The wick structure may include a wire mesh or grooves along the heat pipe walls, or any other porous member. Each heat pipe 33 can be made from a thermally conductive and rigid material such as aluminum or copper, although the invention is not limited in scope in this respect. Base plate 31 may be placed adjacent to a PCB (as described below with reference to FIG. 6) and may include a hole 37 for insertion of one or more IC chips into the PCB.

Referring to FIG. 4, an I/O plate 41 constructed according to an embodiment of the present invention is shown. As with base plate 31 of FIG. 3, the I/O plate is formed with an integrated heat pipe. I/O plate 41 includes a number of openings 43 for the appropriate connector structure (not specifically shown in FIG. 4) that connects components in the laptop computer 10 (see FIG. 1) with any of a variety of peripheral devices. In this embodiment, a single heat pipe structure 45 is provided that extends around the periphery of I/O plate 41 and extends between connectors 43. One skilled in the art will appreciate that heat pipe structure 45 may be modified so as to be customized to meet laptop computer design features.

Figure 5:
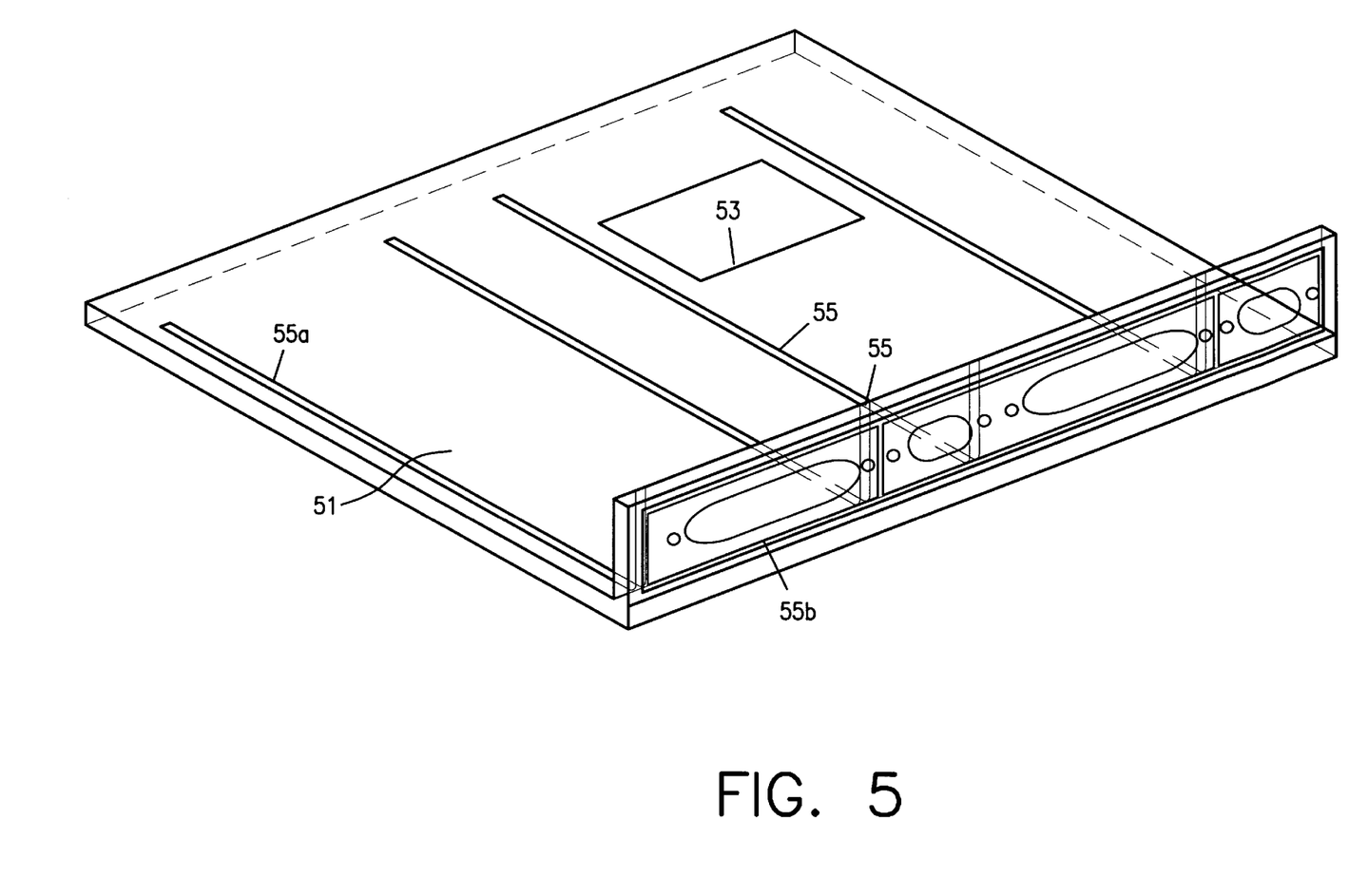
FIG. 5 is a view of a base plate and an I/O plate constructed according to an embodiment of the present invention.

In FIGS. 3 and 4, base plate heat pipe 31 and I/O plate heat pipe 41 are shown as separate components. These components may be thermally coupled together (e.g., using a standard heat pipe as is known in the art). Referring to FIG. 5, a combined base plate-I/O plate heat pipe according to an embodiment of the present invention is shown. Combined base plate-I/O plate heat pipe 51 comprises a unitary structure and extends adjacent to and under the PCB. This unitary structure 51 may include a hole 53 for the insertion of ICs into the PCB (the PCB is discussed below with reference to FIG. 6). Combined base plate-I/O plate heat pipe 51 comprises an integrated heat pipe structure 55. In this embodiment, structure 55 includes more than one heat pipe (e.g., element 55a) that extends in parallel along the base plate portion of combined structure 51 and extends up a face of the I/O plate portion of the combined structure 51. Structure 55 may also include element 55b in the I/O plate portion of the combined structure 51 (as described above with respect to FIG. 4). All of the heat pipes of structure 55 may be coupled together so that heat from one portion of the structure may be effectively distributed throughout the base plate and I/O plates of structure 55, although the invention is not limited in scope in this respect.

Figure 6:
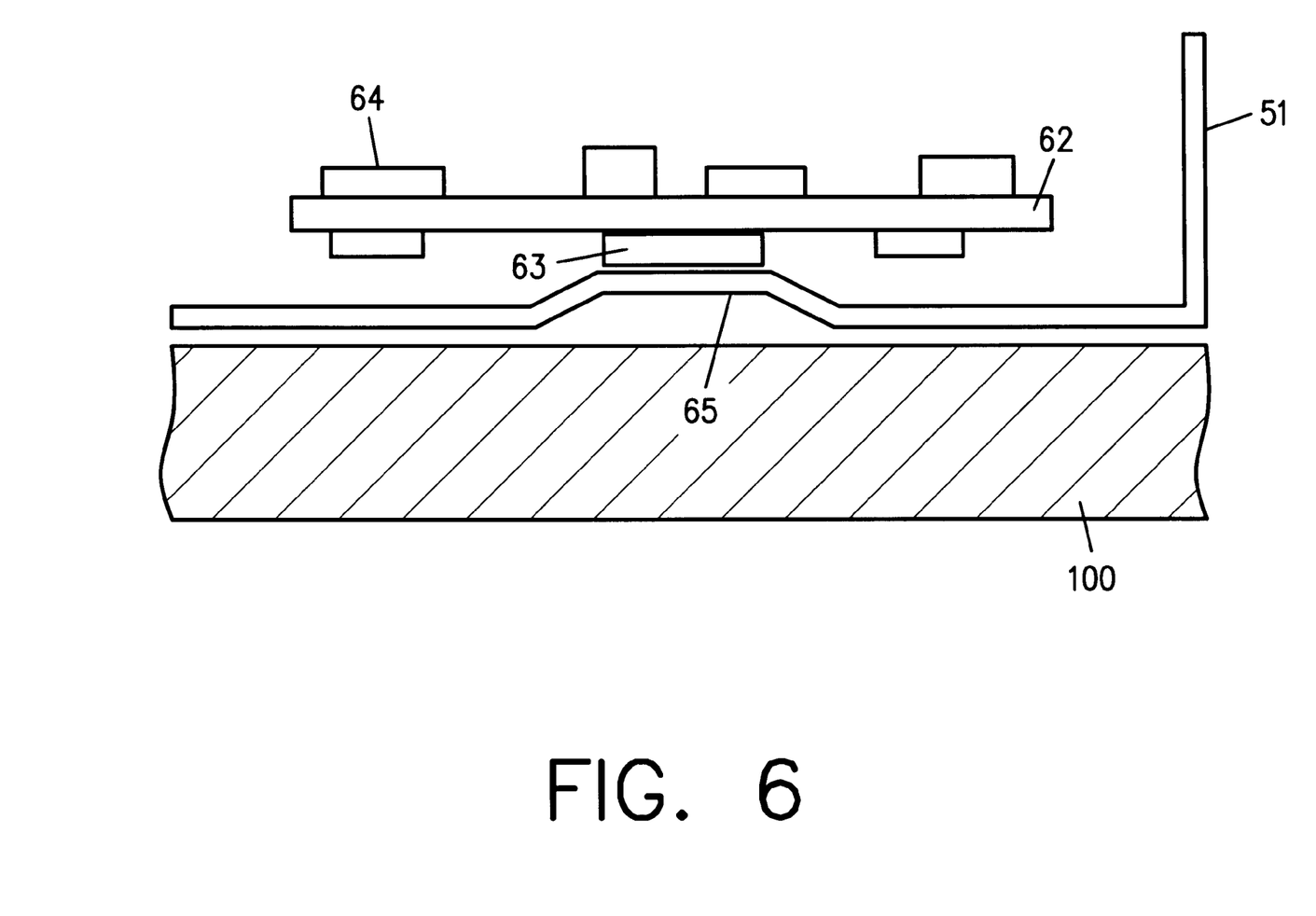
FIG. 6 is a side view of the base plate of FIG. 6 adjacent to a PCB.

Referring to FIG. 6, a side view of the combined base plate-I/O plate heat pipe 51 of FIG. 5 is shown. The combined plate heat pipe is shown coupled adjacent to and beneath a PCB 62, which encompasses an electronic circuit including IC chips 63, 64. In this embodiment, IC chip 63 is a processor, although the invention is not limited in scope in this respect. Referring back to FIGS. 3 and 5, the hole 37, 53 in the base plate portion of the heat pipe plate may be placed in the location of a processor to allow easy insertion thereof on PCB 62. Heat pipe plate 51 may be coupled to the PCB 62 or to the chassis of a laptop computer 100 by any of a variety of fastening techniques such as screws. The design of heat pipe plate 51 may be modified by providing a projection portion 65 which extends toward a heat producing component, such as processor 63. Such a projection portion 65 reduces the possibility of a warm spot appearing in the chassis 100 in the area near processor 63. The projection portion 65 may be thermally coupled to processor 63 via a standard heat pipe as is known in the art or through conductive grease or the like (not shown).

Using a base plate or I/O plate with an integrated heat pipe results in improved thermal conductivity for these components. For example, a steel or aluminum base plate that is not made with an integrated heat pipe has a thermal conductivity of 16–50 and 80–200 W/m-K, respectively. A base plate constructed according to an embodiment of the present invention has a thermal conductivity over 10,000 W/m-K. This improved thermal conductivity allows a base plate and/or I/O plate of an embodiment of the present invention to effectively distribute heat generated in a laptop computer or the like. In an embodiment of the present invention, heat tends to be evenly distributed (e.g., isothermal), thus reducing areas of the base plate and/or I/O plate that are excessively warm.

Figure 7:
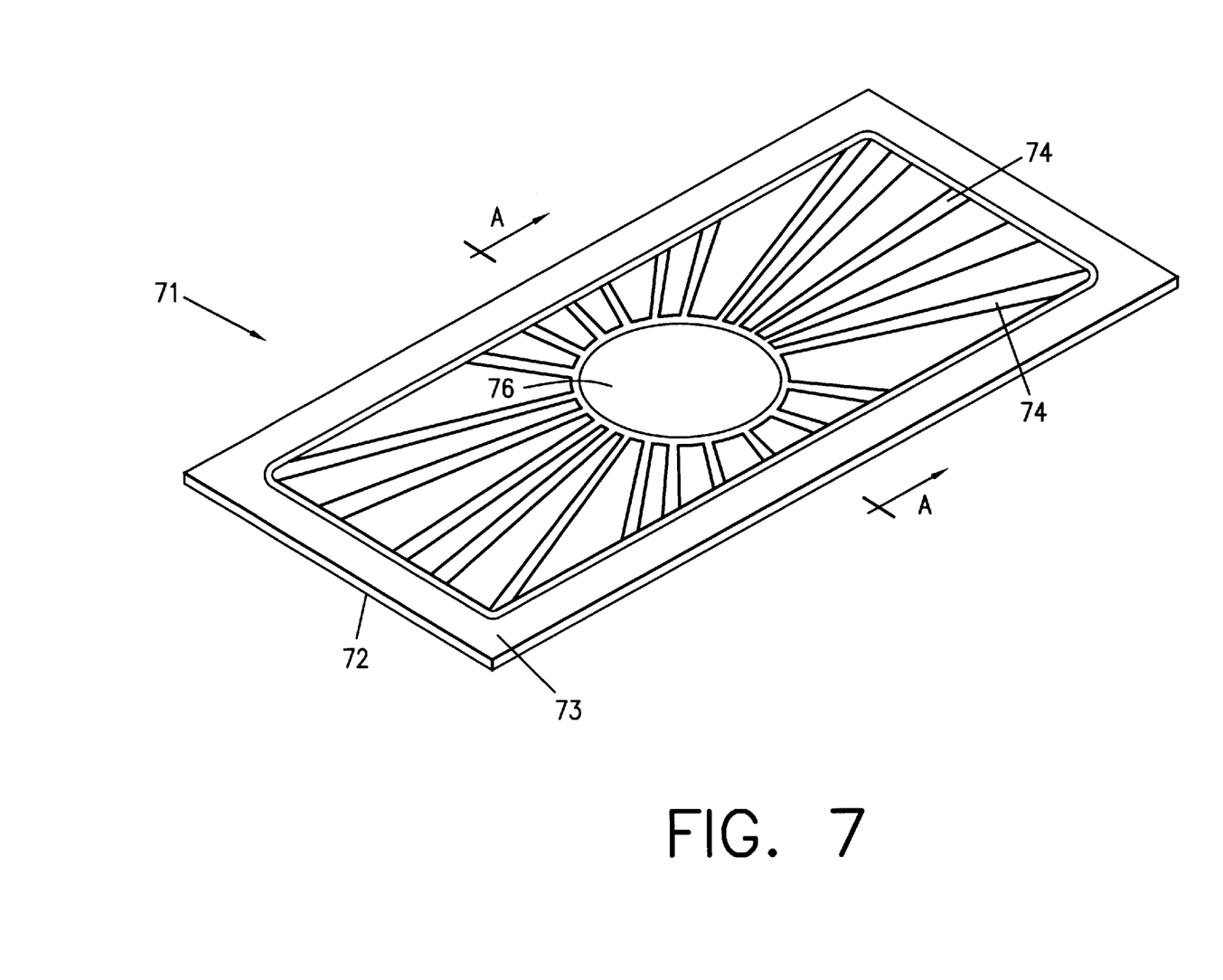
FIG. 7 is a view of base plate constructed according to an another embodiment of the present invention.

In addition to thermal efficiency, the base and I/O plates of an embodiment of the present invention have a low weight, are mechanically rigid, and are cost efficient. As described above, the base plate or I/O plate may be integrated with a plurality of parallel, round heat pipes as shown in FIG. 3. An alternative structure for the base and I/O plates is shown in FIGS. 4, 5, and 7. Referring to FIG. 7, a base plate 71 is shown including two thin metal plates 72 and 73 that are joined by a roll pressing process. The base plate 71 may be made by first stamping, milling or otherwise forming one or more heat pipe channels 74 within one, or both, of metal plates 72 and 73. Channels 74 may include a wicking structure such as grooves within the channel that are formed during the stamping or milling process. Alternatively, a metal mesh or other porous member may be attached to the walls of channels 74. Once plates 72 and 73 have been joined and sealed, channels 74 are evacuated and then charged with a working fluid. In the embodiment shown in FIG. 7, channels 74 radiate from area 76. Placing area 76 close to an IC chip (e.g., a processor) may result in an improved distribution of heat generated by the IC chip.

Figure 8:
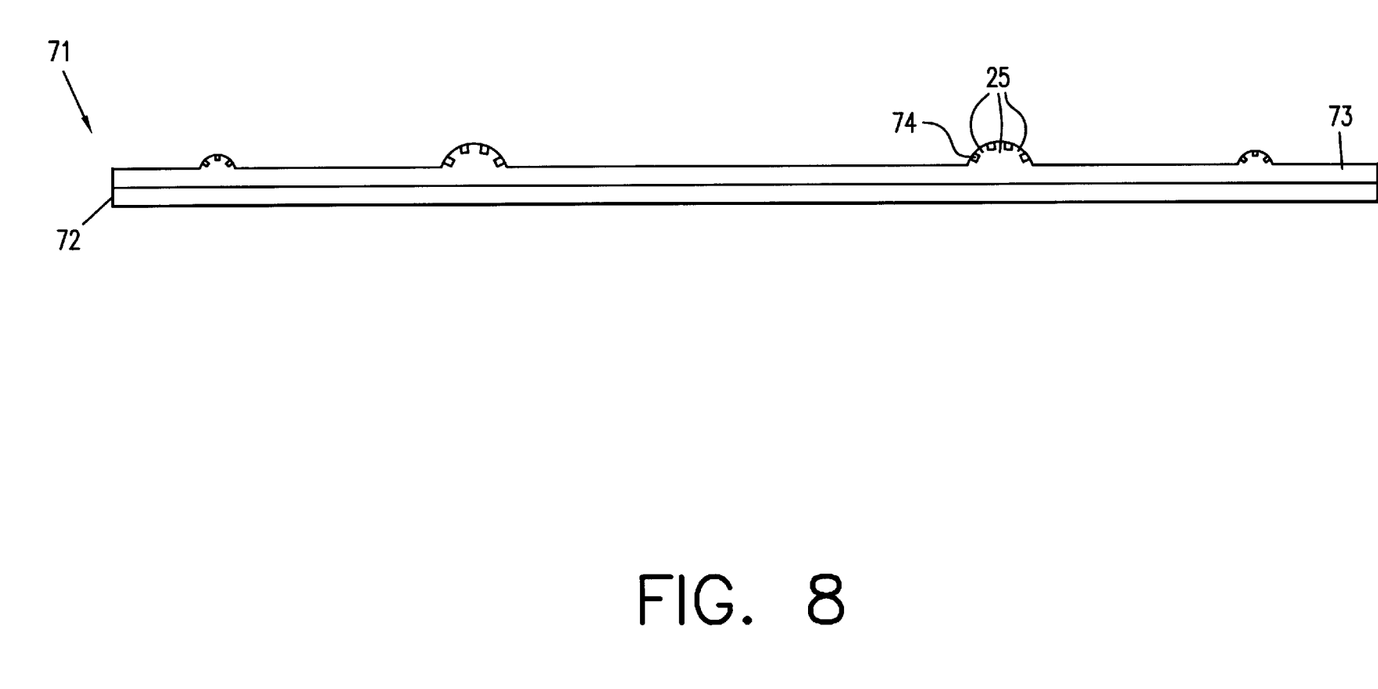
FIG. 8 is a cross-sectional view of the base plate of FIG. 7.

Referring to FIG. 8, a cross-sectional view of the base plate 71 of FIG. 7 along line A—A is shown. In this example, each channel 74 includes grooves 75 that extend along a channel's length although the invention is not limited in scope in this respect. As described above, the grooves 75 may serve as a wicking structure in the channel 74.

Although several embodiments are specifically illustrated and described herein, it will be appreciated that modifications and variations of the present invention are covered by the above teachings and within the purview of the appended claims without departing from the spirit and intended scope of the invention. For example, the base plate and/or I/O plates described herein with integrated heat pipes may be substantially planar or may have other shapes as needed to improve heat management in conjunction with electronic circuitry or the like.

What is claimed is:

1. An apparatus comprising:
    an input/output plate for a computer system, wherein said input/output plate includes at least one opening, and wherein said input/output plate forms an integrated heat pipe.

2. The apparatus of claim 1 further comprising:
    a base plate including a separate integrated heat pipe, said base plate being thermally coupled to said input/output plate.

3. The apparatus of claim 2 wherein said base plate and said input/output plate comprise a unitary structure.

4. An apparatus for managing heat comprising: a printed circuit board including a location for at least one integrated circuit;
    a base plate positioned adjacent to said printed circuit board, said base plate including an integrated heat pipe, wherein said base plate forms said heat pipe, said base plate includes a projection portion in an area proximate to said location for at least one integrated circuit, where said projection portion extends toward said integrated circuit.

5. The apparatus of claim 4, wherein said integrated circuit includes a processor.

6. The apparatus of claim 4 wherein said processor includes a microprocessor.

7. The apparatus of claim 4, wherein said base plate includes a hole adapted for insertion of said at least one integrated circuit on said printed circuit board.

8. The apparatus of claim 4, further comprising:
    an input/output plate including an integrated heat pipe wherein said input/output plate forms said integrated heat pipe and includes at least one opening;
    said input/output plate coupled to said base plate.

9. The apparatus of claim 8 wherein said base plate and said input/output plate comprise a unitary structure and said unitary structure forms said heat pipe.

10. A laptop computer comprising: a printed circuit board; and a base plate positioned between said printed circuit board and a bottom portion of said laptop computer, said printed circuit board includes a location for at least one processor, and said base plate including an integrated heat pipe, wherein said base plate forms said heat pipe and said base plate includes a projection portion in an area proximate to said at least one processor, where said projection portion extends toward said processor.

11. The apparatus of claim 10 wherein said base plate includes a hole adapted for insertion of said processor into said printed circuit board.

12. The apparatus of claim 10, further comprising: an input/output plate including an integrated heat pipe wherein said input/output plate forms said integrated heat pipe and includes at least one opening, with said input/output plate coupled to said base plate.

13. The apparatus of claim 12 wherein said base plate and said input/output plate comprise a unitary structure, wherein said unitary structure forms said heat pipe.

* * * * *